US011189513B1

(12) United States Patent
Chu et al.

(10) Patent No.: US 11,189,513 B1
(45) Date of Patent: Nov. 30, 2021

(54) TRANSPORT MECHANISM FOR WAFERS OF DIFFERENT SIZES AND TYPES

(71) Applicant: E&R ENGINEERING CORPORATION, Kaohsiung (TW)

(72) Inventors: Yu-Min Chu, Kaohsiung (TW); Cho-Chun Chung, Kaohsiung (TW); Chia-Hsiu Huang, Kaohsiung (TW)

(73) Assignee: E&R ENGINEERING CORPORATION, Kaohsiung (TW)

( * ) Notice: Subject to any disclaimer, the term of this patent is extended or adjusted under 35 U.S.C. 154(b) by 36 days.

(21) Appl. No.: 16/907,502

(22) Filed: Jun. 22, 2020

(30) Foreign Application Priority Data

May 7, 2020 (TW) ................................ 109115199

(51) Int. Cl.
*H01L 21/677* (2006.01)
*B25J 11/00* (2006.01)

(52) U.S. Cl.
CPC ..... *H01L 21/67742* (2013.01); *B25J 11/0095* (2013.01); *H01L 21/67766* (2013.01)

(58) Field of Classification Search
CPC ......... H01L 21/67709; H01L 21/67303; H01L 21/67766; H01L 21/67742; B25J 11/0095
See application file for complete search history.

(56) References Cited

U.S. PATENT DOCUMENTS

| 2010/0272544 A1* | 10/2010 | Rivollier | H01L 21/67766 414/222.01 |
| 2015/0016935 A1* | 1/2015 | Hashimoto | B25J 9/0084 414/744.5 |
| 2016/0082599 A1* | 3/2016 | Wakabayashi | H01L 21/67201 414/744.5 |
| 2016/0218030 A1* | 7/2016 | Embertson | B25J 15/0266 |
| 2018/0211860 A1* | 7/2018 | Kuo | H01L 21/67379 |
| 2020/0020558 A1* | 1/2020 | Liao | H01L 21/67781 |
| 2020/0198156 A1* | 6/2020 | Kasahara | B65G 47/90 |

* cited by examiner

*Primary Examiner* — Kaitlin S Joerger
(74) *Attorney, Agent, or Firm* — Birch, Stewart, Kolasch & Birch, LLP

(57) ABSTRACT

A transport mechanism for wafers of different sizes and types includes a carrier device and a manipulator device. The carrier device has a mounting rack, multiple supporting units, and multiple carrier units. The multiple supporting units are mounted on the mounting rack, and each supporting unit has two supporting bases. Each one of the multiple carrier units has two carrier plates. Each one of the two carrier plates has a connecting rod and two positioning rods. The two positioning rods are respectively located on two sides of the connecting rod. The manipulator device has a driving unit and a manipulator unit. The manipulator unit is mounted on the driving unit and has two arms. Each one of the two arms has a connecting socket and two positioning sockets. The two positioning sockets are respectively located beside the connecting socket. The locking element is movably mounted to the arm.

19 Claims, 17 Drawing Sheets

TRANSPORT MECHANISM FOR WAFERS OF DIFFERENT SIZES AND TYPES

BACKGROUND OF THE INVENTION

1. Field of the Invention

The present invention relates to a transport mechanism, and more particularly to a transport mechanism for wafers of different sizes and types.

2. Description of Related Art

A conventional wafer transporting mechanism has an adsorbing device disposed thereon. The conventional wafer transporting mechanism transports a wafer by adsorbing the wafer placed on the adsorbing device. Wafers are available in a variety of sizes and types, and the adsorbing device of the conventional wafer transporting mechanism does not suit wafers of all sizes and types. Thus, the conventional wafer transporting mechanism lacks practicality and is unable to meet the requirements of the industry.

To overcome the shortcomings of the conventional wafer transporting mechanism, the present invention tends to provide a transport mechanism for wafers of different sizes and types to mitigate or obviate the aforementioned problems.

SUMMARY OF THE INVENTION

The main objective of the present invention is to provide a transport mechanism for wafers of different sizes and types.

The transport mechanism for wafers of different sizes and types includes a carrier device and a manipulator device. The carrier device has a mounting rack, multiple supporting units, and multiple carrier units. The multiple supporting units are mounted on the mounting rack at spaced intervals, and each one of the multiple supporting units has two supporting bases. Each one of the two supporting bases has a magnet, a space, and a sensor set. The magnet is disposed within the supporting base. The space is formed on a top surface of the supporting base and is above the magnet. The sensor set is disposed on the top surface of the supporting base. The multiple carrier units are respectively mounted to the multiple supporting units, and each one of the multiple carrier units has two carrier plates. Each one of the two carrier plates has a connecting rod and two positioning rods. The connecting rod is mounted through an end of the carrier plate, is above the space of a corresponding one of the two supporting bases, and has an annular groove formed on an outer surface of the connecting rod. The two positioning rods are mounted through the same end of the carrier plate as the connecting rod is, and the two positioning rods are respectively located on two sides of the connecting rod.

The manipulator device is spaced apart from the carrier device and has a driving unit and a manipulator unit. The manipulator unit is mounted on the driving unit, is controlled by the driving unit, is selectively connected to one of the multiple carrier units of the carrier device automatically, and has two arms. Each one of the two arms has a connecting socket, two beads, two positioning sockets, a locking element, and at least one restoring element. The connecting socket extends into an end of the arm and has two abutted grooves respectively formed on two sides of the connecting socket. The two beads are disposed in the two abutted grooves of the connecting socket respectively. The two positioning sockets extend into the same end of the arm as the connecting socket does and are respectively located beside the connecting socket. The locking element is movably mounted to the arm, abuts against the two beads, and has two protruding portions respectively formed on two inner side surfaces of the locking element.

The at least one restoring element is connected to the arm and the locking element. When each one of the two arms of the manipulator unit is driven by the driving unit and moves to the carrier device, each one of the two arms is then connected to a respective one of the two carrier plates of one of the multiple carrier units. The sensor set senses the connection between each one of the two arms and the corresponding carrier plate. The two positioning rods of each one of the two carrier plates extend into the two positioning sockets of the corresponding arm, and the connecting rod of each one of the two carrier plates extends into the connecting socket of the corresponding arm. The locking element of each one of the two arms is attracted by the magnet and moves downwardly into the space of the corresponding supporting base to form an unlocked state. When each one of the two arms is driven by the driving unit and moves upwardly, the attraction of the magnet to the locking element gradually decreases to zero and the locking element gradually moves back to its original position relative to the arm. The two protruding portions of the manipulator unit respectively push the two beads to move toward each other and the two beads move into the annular groove of the connecting rod to position the connecting rod to form a locked state.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
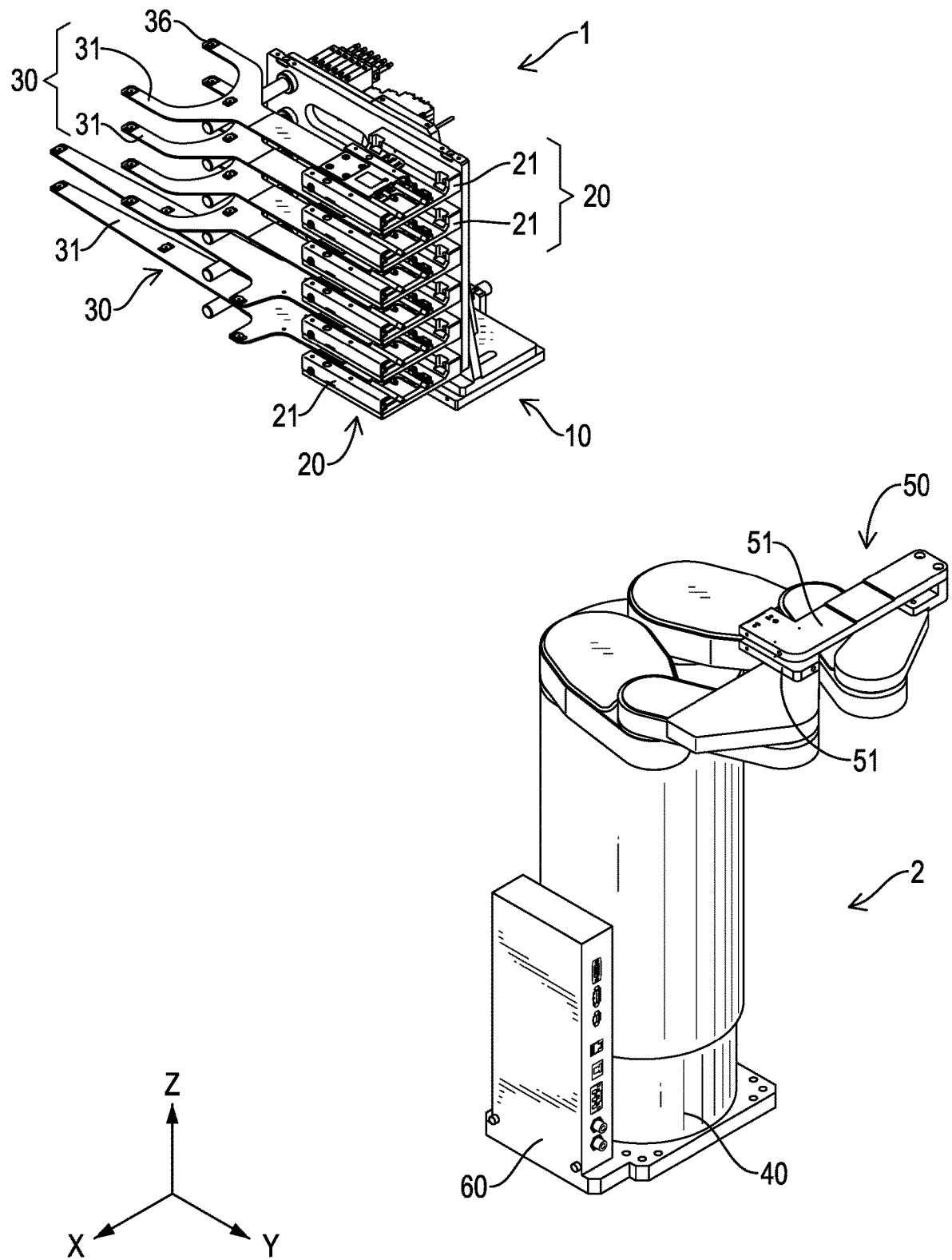
FIG. 1 is a perspective view of a transport mechanism for wafers of different sizes and types in accordance with the present invention.
Figure 2:
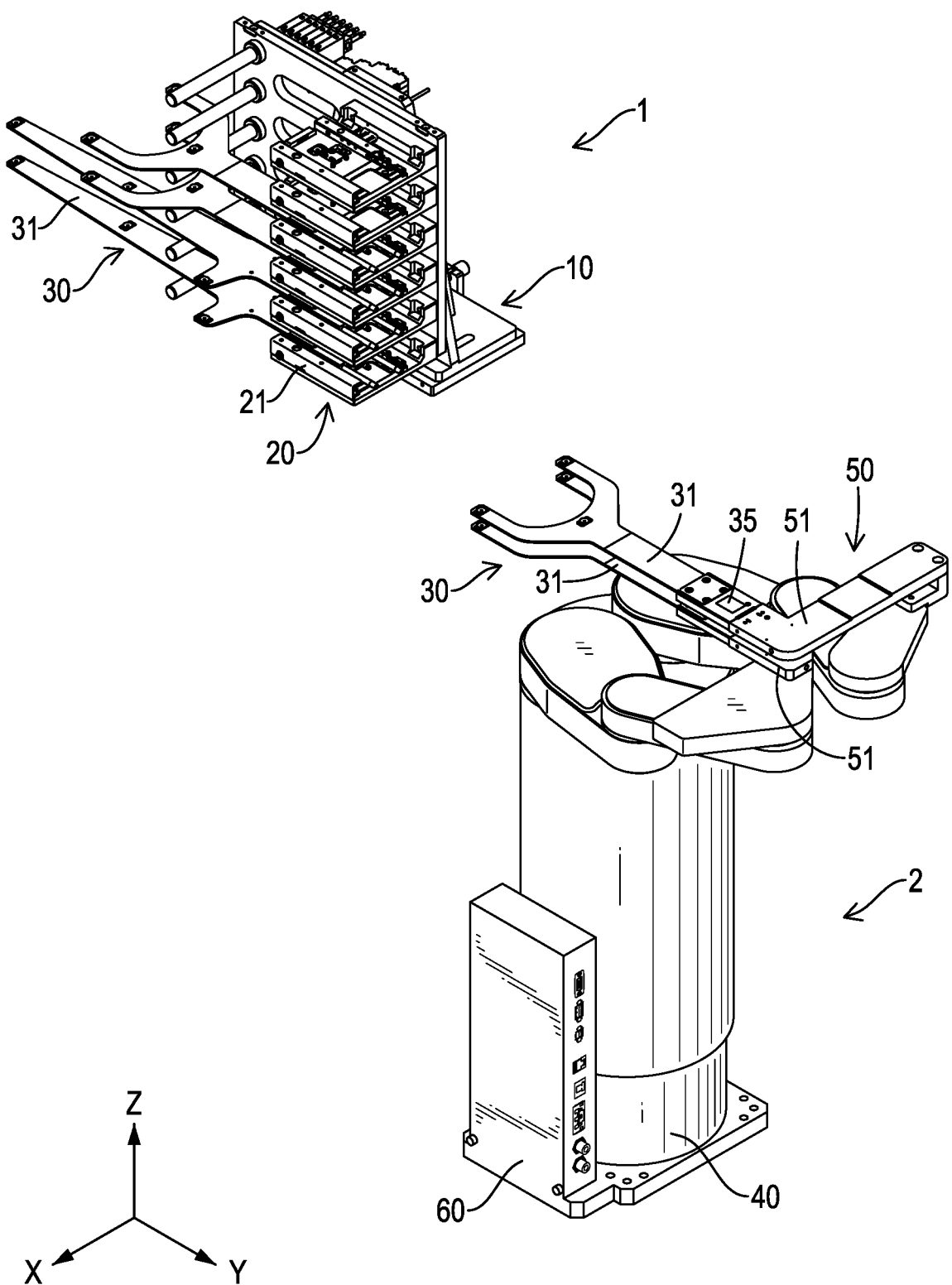
FIG. 2 is an operational perspective view of the transport mechanism for wafers of different sizes and types in FIG. 1.

With reference to FIGS. 1 and 2, a transport mechanism for wafers of different sizes and types in accordance with the present invention includes a carrier device 1 and a manipulator device 2.

With reference to FIGS. 1 and 2, the carrier device 1 has a mounting rack 10, multiple supporting units 20, and multiple carrier units 30. The multiple supporting units 20 are mounted on the mounting rack 10 at spaced intervals, and each one of the multiple supporting units 20 has two supporting bases 21. Each one of the multiple carrier units 30 is mounted to a respective one of the multiple supporting units 20, and each one of the multiple carrier units 30 has two carrier plates 31. The two carrier plates 31 of the carrier unit 30 are respectively disposed on the two supporting bases 21 of the corresponding supporting unit 20. With reference to FIGS. 4 to 7, each one of the two supporting bases 21 of the supporting unit 20 has a magnet 22, a space 23, and a sensor set 24. The magnet 22 is disposed within the supporting base 21. The space 23 is formed on a top surface of the supporting base 21 and is above the magnet 22. The sensor set 24 is disposed on the top surface of the supporting base 21.

Figure 6:
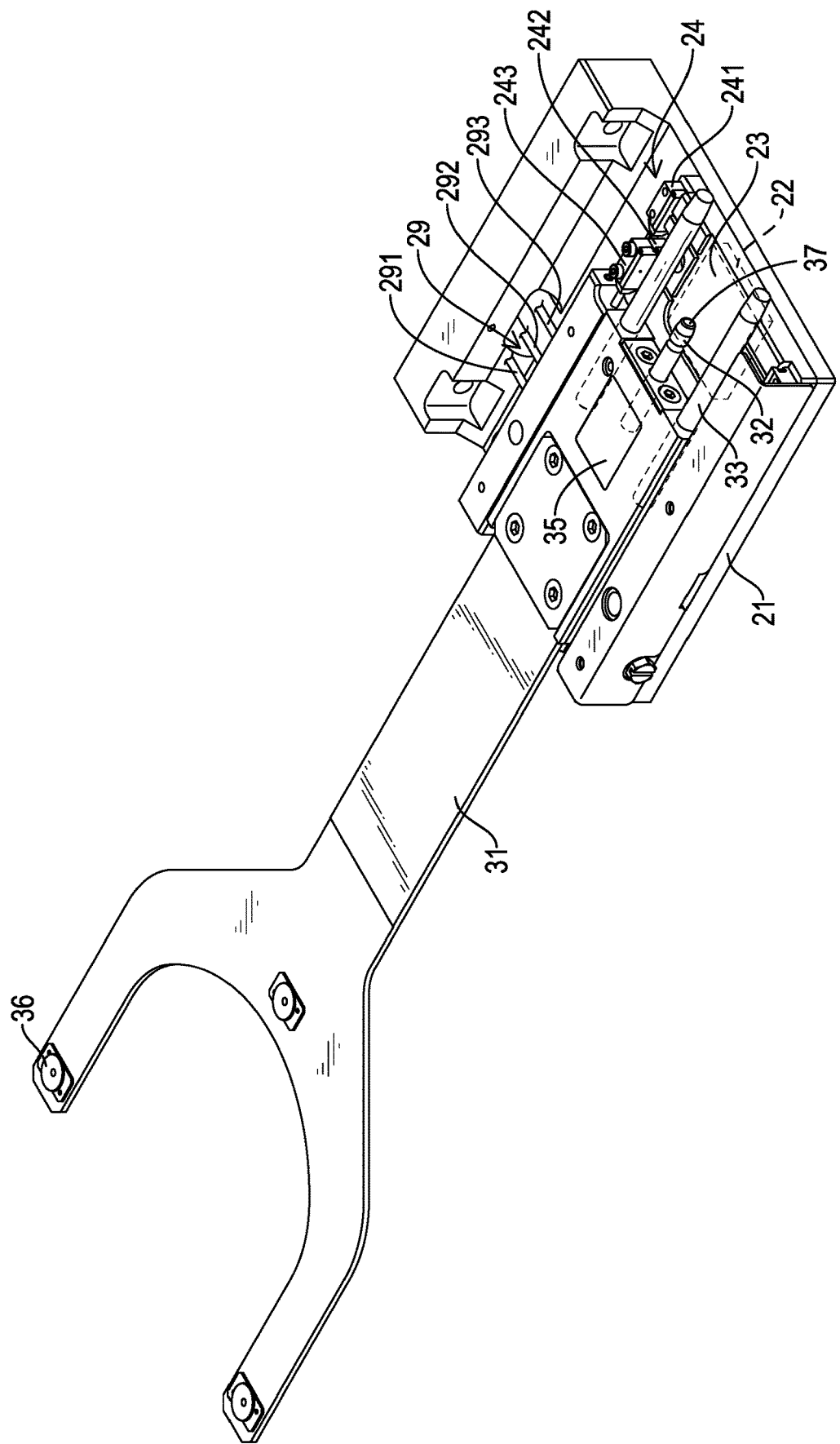
FIG. 6 is an enlarged perspective view showing a carrier plate disposed on a supporting base of the transport mechanism for wafers of different sizes and types in FIG. 1.
Figure 7:
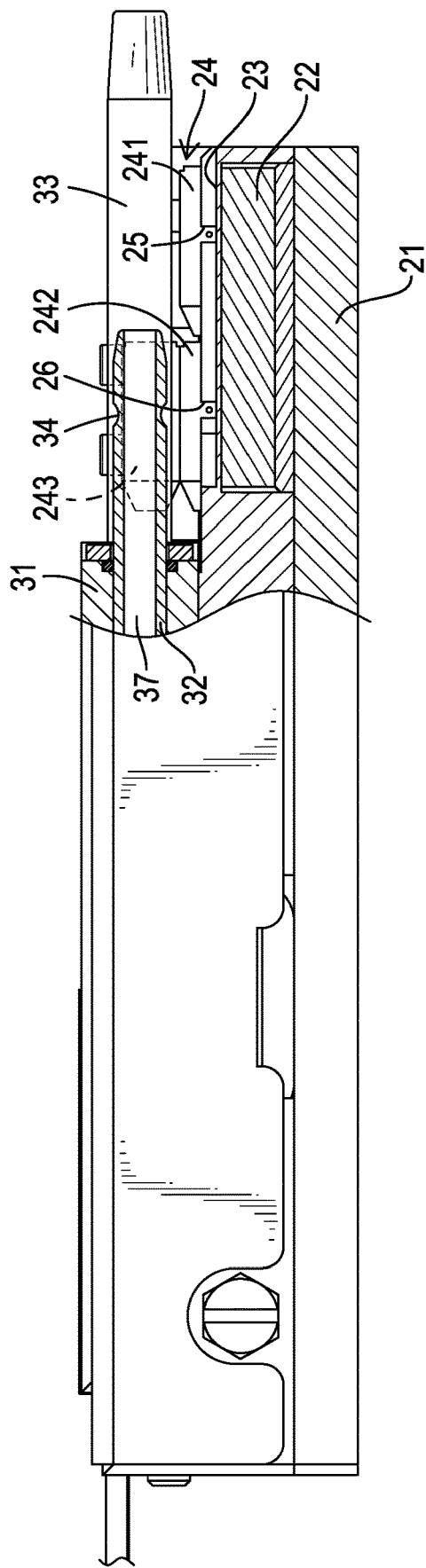
FIG. 7 is an enlarged cross-sectional side view in partial section of the transport mechanism for wafers of different sizes in FIG. 6, shown with the carrier plate disposed on the supporting base.

With reference to FIGS. 6 and 7, each one of the two carrier plates 31 of the carrier unit 30 has multiple suckers 36, a connecting rod 32, and two positioning rods 33. The multiple suckers 36 are disposed on a top surface of the carrier plate 31, is adjacent to an edge of the carrier plate 31, and is away from the supporting base 21. The connecting rod 32 is mounted through an end of the carrier plate 31, is away from the multiple suckers 36, is above the space 23 of the supporting base 21, and has an annular groove 34 and a through hole 37. The annular groove 34 is formed on an outer surface of the connecting rod 32. The through hole 37 is formed through the connecting rod 32, and the through hole 37 is located at a center of the connecting rod 32. The two positioning rods 33 are mounted through the same end of the carrier plate 31 as the connecting rod 32 is, and the two positioning rods 33 are respectively located on two sides of the connecting rod 32.

Figure 3:
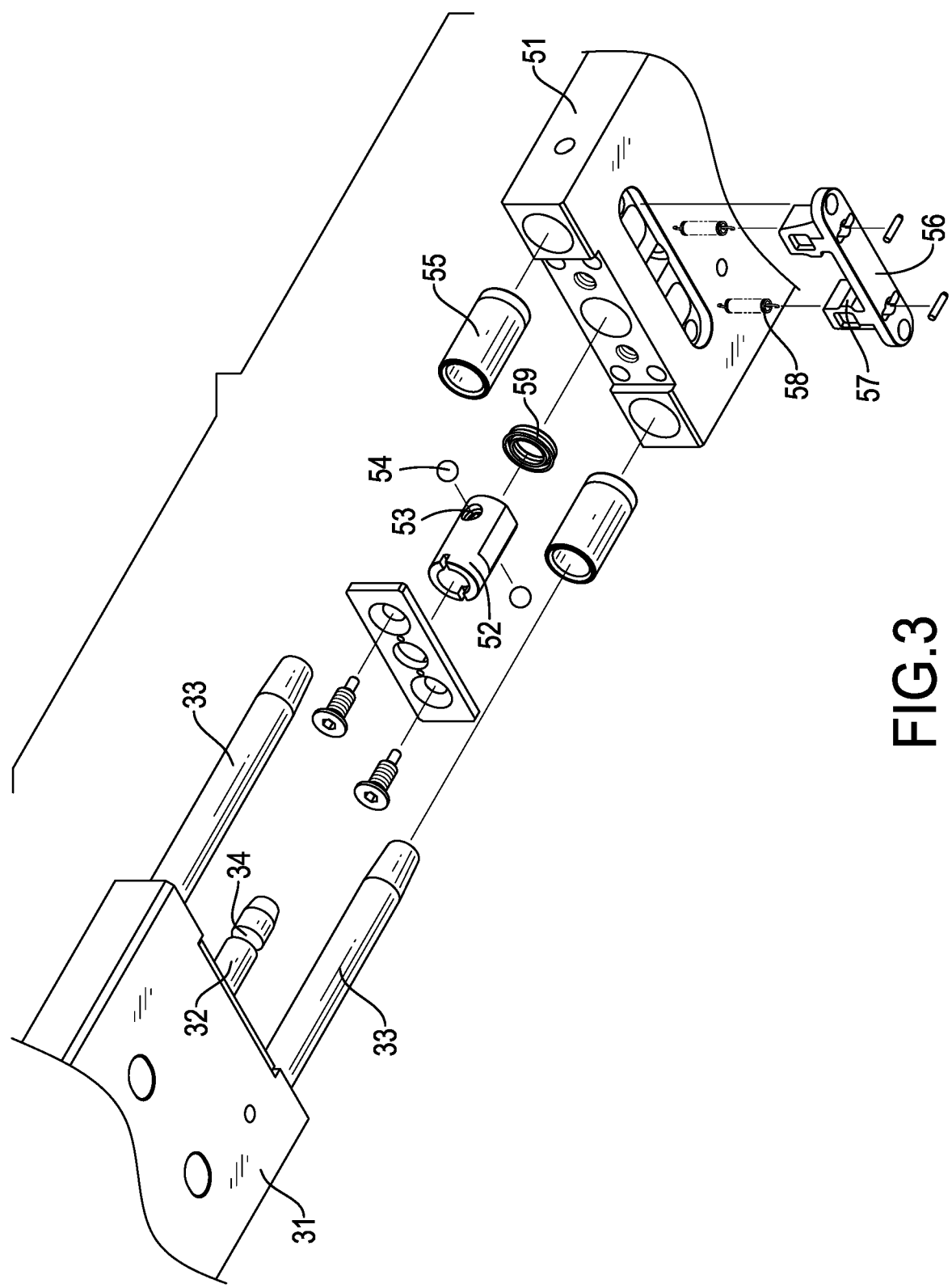
FIG. 3 is an enlarged exploded perspective view of the transport mechanism for wafers of different sizes and types in FIG. 1.
Figure 12:
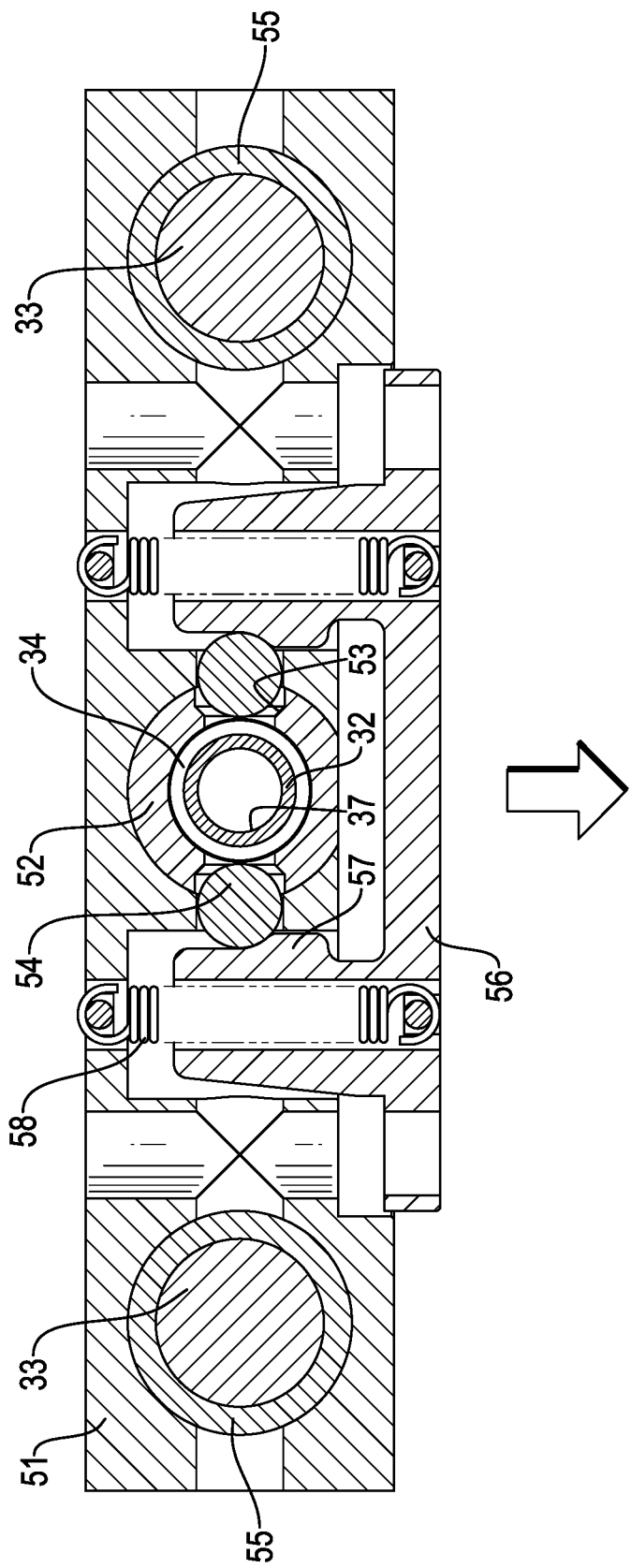
FIG. 12 is a cross-sectional side view of the transport mechanism for wafers of different sizes and types in FIG. 1, shown with the transport mechanism being in an unlocked state.
Figure 14:
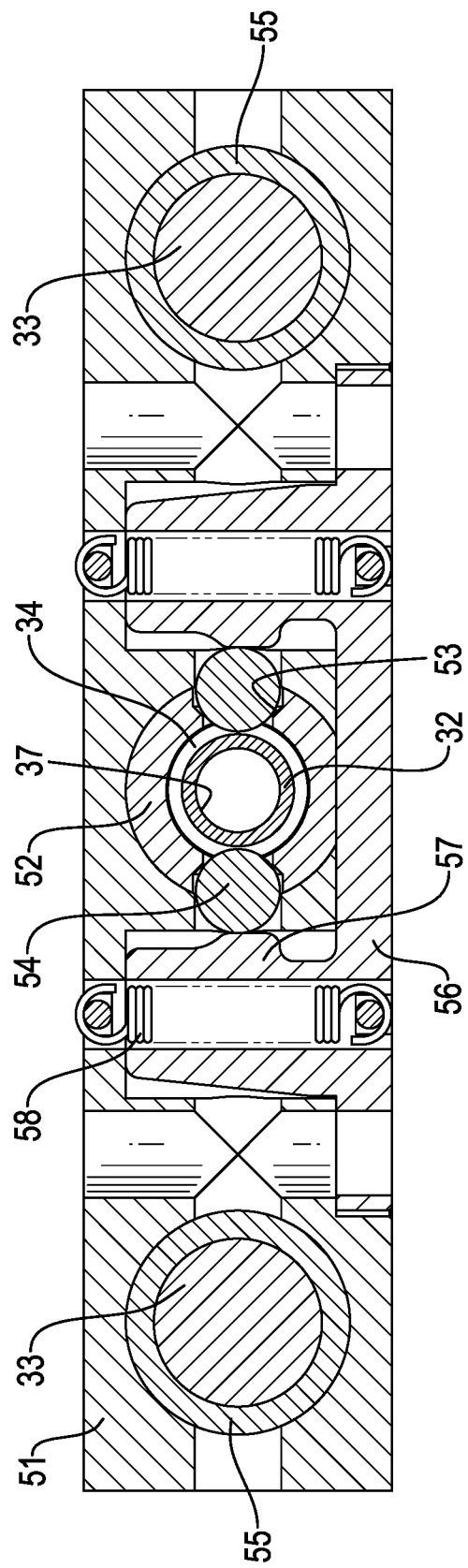
FIG. 14 is a cross-sectional side view of the transport mechanism for wafers of different sizes and types in FIG. 1, shown with the transport mechanism being in a locked state.

With reference to FIGS. 1 and 2, the manipulator device 2 is spaced apart from the carrier device 1 and has a driving unit 40 and a manipulator unit 50. The manipulator unit 50 is mounted on the driving unit 40 and is controlled by the driving unit 40. The manipulator unit 50 is connected to or disconnected from one of the multiple carrier units 30 of the carrier device 1 automatically when controlled by the driving unit 40, and the manipulator unit 50 has two arms 51 arranged at a spaced interval. With reference to FIGS. 3, 12, and 14, each one of the two arms 51 of the manipulator unit 50 has a connecting socket 52, two beads 54, two positioning sockets 55, a locking element 56, and at least one restoring element 58. The connecting socket 52 extends into an end of the arm 51 adjacent to one of the multiple carrier units 30 and has two abutted grooves 53. The two abutted grooves 53 are respectively formed on two sides of the connecting socket 52.

The two beads 54 are movably disposed in the two abutted grooves 53 of the connecting socket 52, respectively. The two positioning sockets 55 extend into the same end of the arm 51 as the connecting socket 52 does, and the two positioning sockets 55 are respectively located beside the connecting socket 52. The locking element 56 is movably mounted to the arm 51, abuts against the two beads 54, and has two protruding portions 57. The two protruding portions 57 are formed on two inner side surfaces of the locking element 56 and face each other. The at least one restoring element 58 has two ends. One of the two ends of the at least one restoring element 58 is connected to the arm 51, and the other one of the two ends of the at least one restoring element 58 is connected to the locking element 56. In the present invention, each one of the two arms 51 of the manipulator unit 50 has a vacuum sealing element 59, and the vacuum sealing element 59 is disposed between the connecting socket 52 and the arm 51.

Figure 8:
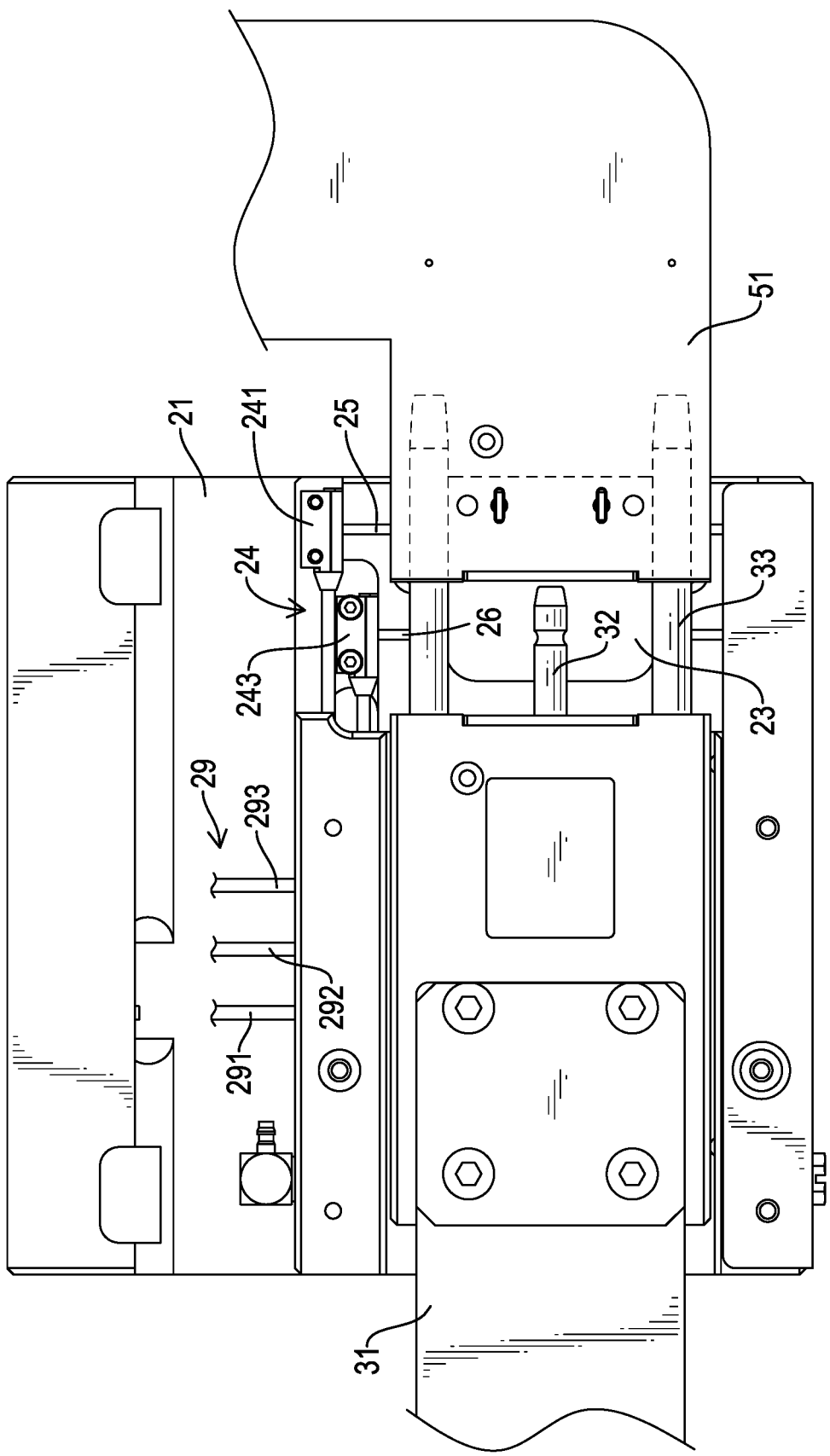
FIG. 8 is a top side view of the transport mechanism for wafers of different sizes and types in FIG. 1, shown with an arm connected to the carrier plate.
Figure 9:
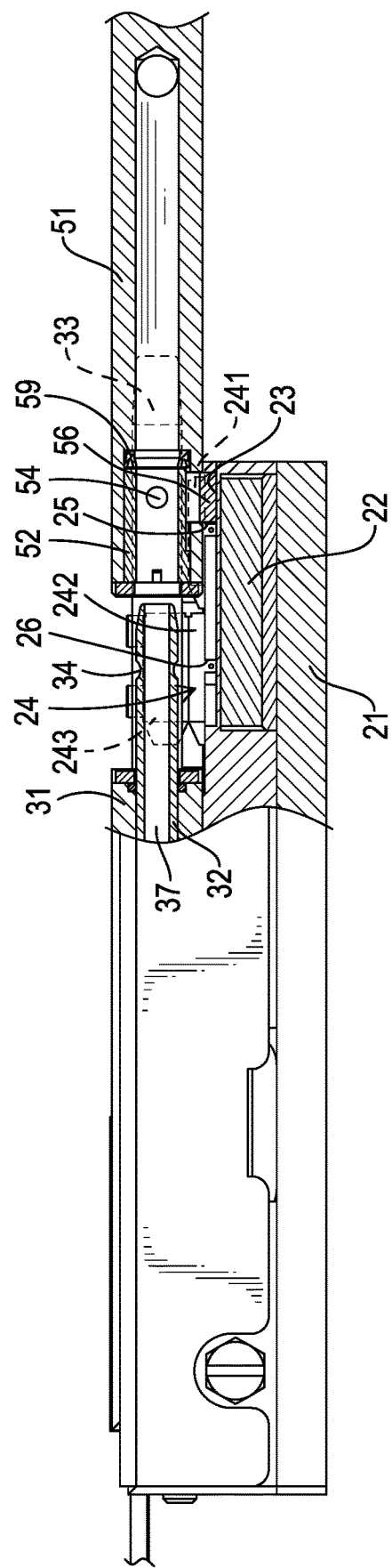
FIG. 9 is an enlarged side view in partial section of the transport mechanism for wafers of different sizes and types in FIG. 8, shown with the arm connected to the carrier plate.

With reference to FIGS. 2 and 8, when each one of the two arms 51 is driven by the driving unit 40 and moves toward the carrier device 1, each one of the two arms 51 is then connected to a respective one of the two carrier plates 31 of one of the multiple carrier units 30. The sensor set 24 senses the connection between each one of the two arms 51 and the corresponding carrier plate 31. With reference to FIGS. 3, 8, and 9, the two positioning rods 33 of the carrier plate 31 extend into the two positioning sockets 55 of the corresponding arm 51, and the connecting rod 32 of the carrier plate 31 extends into the connecting socket 52 of the corresponding arm 51.

Figure 13:
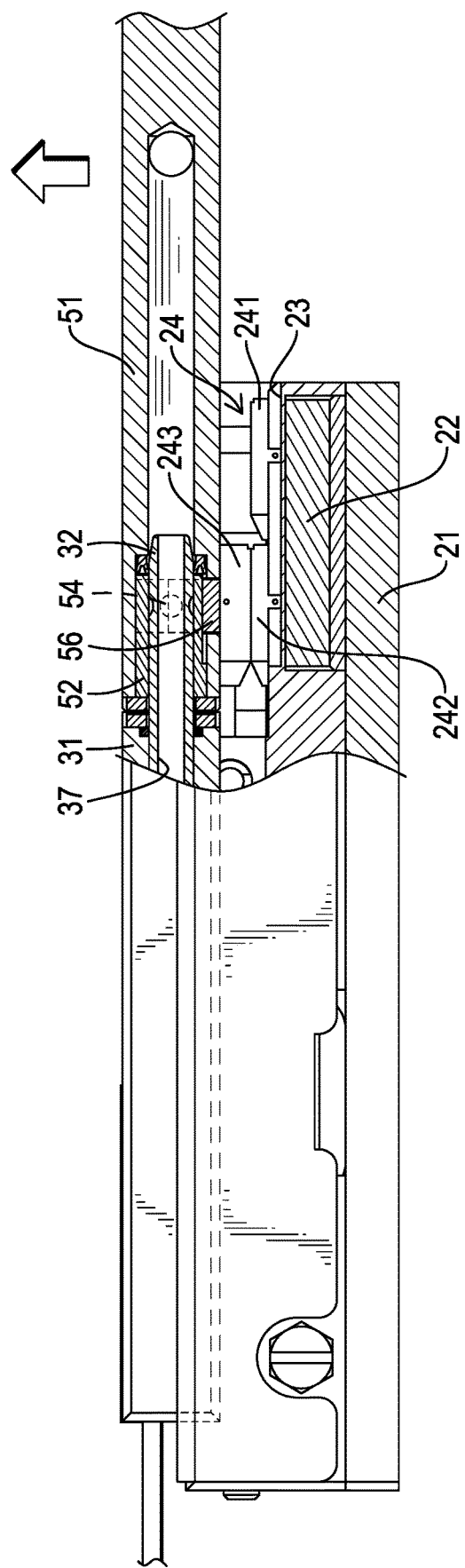
FIG. 13 is an operational side view in partial section of the transport mechanism for wafers of different sizes and types in FIG. 1.

With reference to FIGS. 8, 9, and 12, in the meantime, the locking element 56 is attracted by the magnet 22 and moves downwardly into the space 23 to form an unlocked state. With reference to FIGS. 13 and 14, when the arm 51 is driven by the driving unit 40 and moves upwardly, the attraction of the magnet 22 to the locking element 56 gradually decreases to zero and the locking element 56 gradually moves back to its original position relative to the arm 51. Simultaneously, the two protruding portions 57 of the manipulator unit 50 respectively push the two beads 54 to move toward each other and the two beads 54 move into the annular groove 34 of the connecting rod 32 to position the connecting rod 32. Then a locked state is formed. In the present invention, the manipulator device 2 has a controlling unit 60, and the carrier device 1 and the driving unit 40 are both electrically connected to the controlling unit 60.

Figure 4:
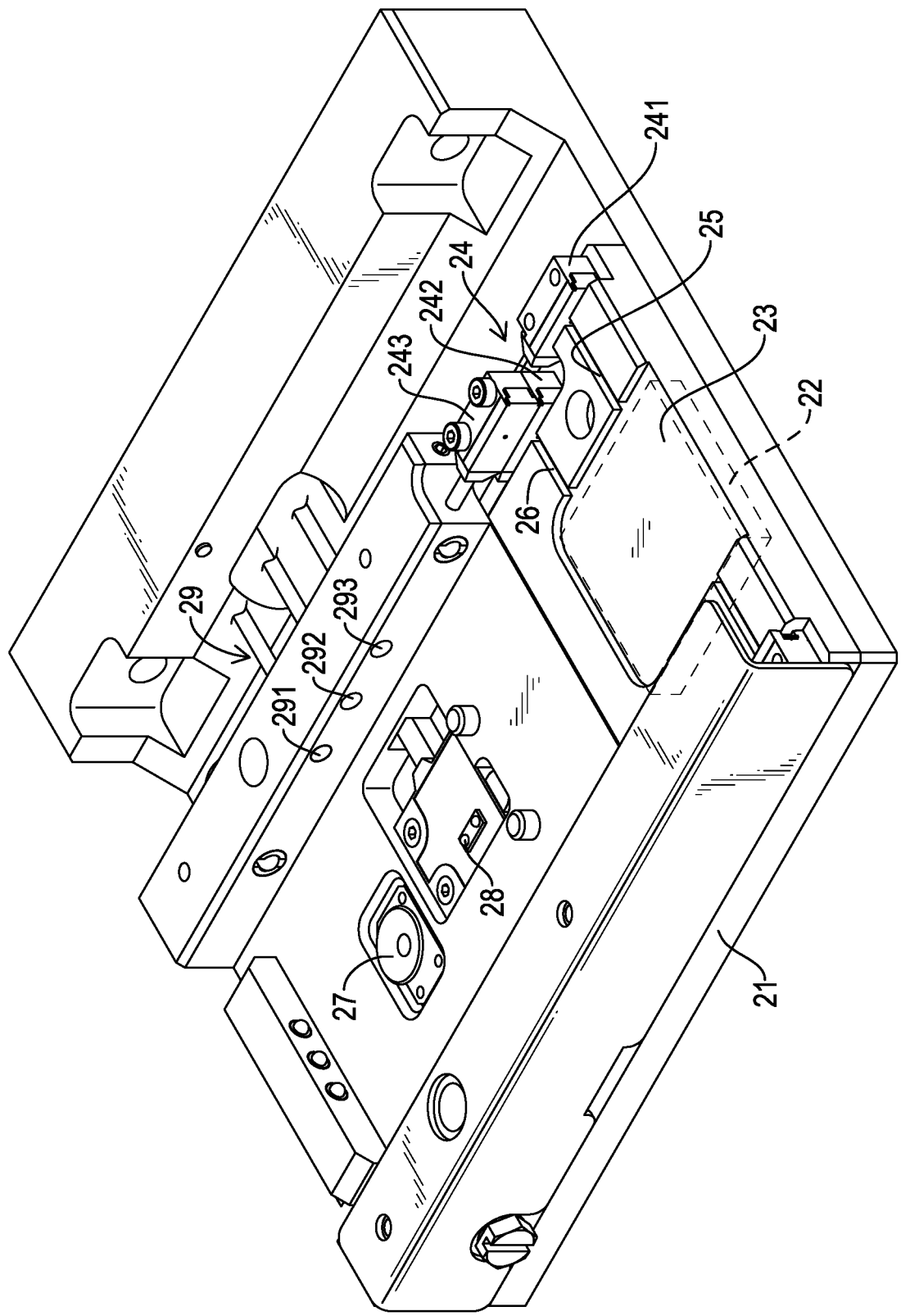
FIG. 4 is an enlarged perspective view of a supporting base of the transport mechanism for wafers of different sizes and types in FIG. 1.
Figure 5:
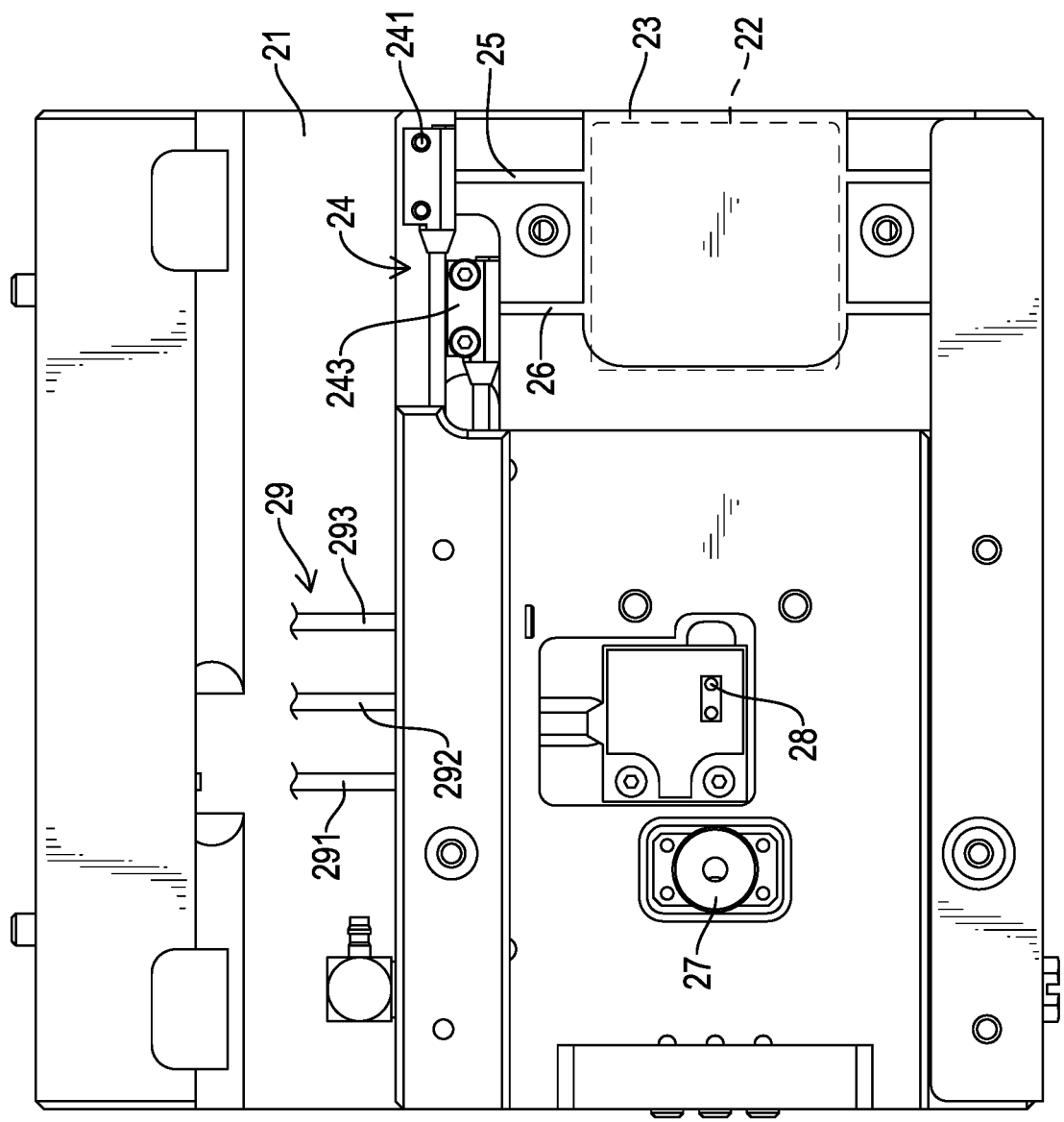
FIG. 5 is a top side view of the supporting base of the transport mechanism for wafers of different sizes and types in FIG. 4.

With reference to FIGS. 4 and 5, each one of the two supporting bases 21 of the supporting unit 20 has a first groove 25 and a second groove 26. The first groove 25 and the second groove 26 are both formed on the supporting base 21, and the first groove 25 and the second groove 26 both communicate with the space 23 of the supporting base 21.

The sensor set 24 has a first sensor 241, a second sensor 242, and a third sensor 243. The first sensor 241 is disposed on the supporting base 21 and faces the first groove 25. The second sensor 242 is disposed on the supporting base 21 and faces the second groove 26. The third sensor 243 is disposed on the second sensor 242.

With reference to FIGS. 4 to 6, each one of the two supporting bases 21 of the supporting unit 20 has an adsorption positioning element 27 and a carrier plate detector 28. The adsorption positioning element 27 is disposed on the supporting base 21, is spaced apart from the space 23, adsorbs the corresponding carrier plate 31 disposed thereon, and positions the corresponding carrier plate 31 disposed thereon. The carrier plate detector 28 is disposed on the supporting base 21, is spaced apart from the space 23 of the supporting base 21, is adjacent to the adsorption positioning element 27, and detects whether the corresponding carrier plate 31 is disposed on the supporting base 21.

If the carrier plate 31 is well placed on the adsorption positioning element 27 of the corresponding supporting base 21 and the carrier plate 31 does not tilt relative to the adsorption positioning element 27, air between the adsorption positioning element 27 and the carrier plate 31 can be evacuated and the carrier plate 31 can be adsorbed by the adsorption positioning element 27 tightly. On the contrary, if the carrier plate 31 is not well placed on the adsorption positioning element 27 of the corresponding supporting base 21 and the carrier plate 31 tilts relative to the adsorption positioning element 27, air between the adsorption positioning element 27 and the carrier plate 31 cannot be evacuated and the adsorption positioning element 27 cannot adsorb the corresponding carrier plate 31. In conclusion, whether the carrier plate 31 is well placed on the adsorption positioning element 27 can be determined by the evacuation status of the adsorption positioning element 27.

With reference to FIGS. 4 and 6, in addition, each one of the two supporting bases 21 of the supporting unit 20 has a model identifying set 29 disposed thereon. The model identifying set 29 has a first identifying element 291, a second identifying element 292, and a third identifying element 293. The first identifying element 291, the second identifying element 292, and the third identifying element 293 are all disposed on the supporting base 21, are disposed at spaced intervals, and all face the corresponding carrier plate 31 disposed on the supporting base 21 to identify a model of the corresponding carrier plate 31. Moreover, each one of the two carrier plates 31 of the carrier unit 30 has an identification element 35 disposed thereon. The model number of the identification element 35 can be identified by an image sensor to identify the model of the corresponding carrier plate 31.

With reference to FIGS. 1 and 2, a coordinate system including an X-axis, a Y-axis, and a Z-axis is defined in the transport mechanism of the present invention. The X-axis, the Y-axis, and the Z-axis are perpendicular to one another. The driving unit 40 drives the manipulator unit 50 to move along the Y-axis, to move along the Z-axis, and to rotate about the Z-axis.

Figure 15:
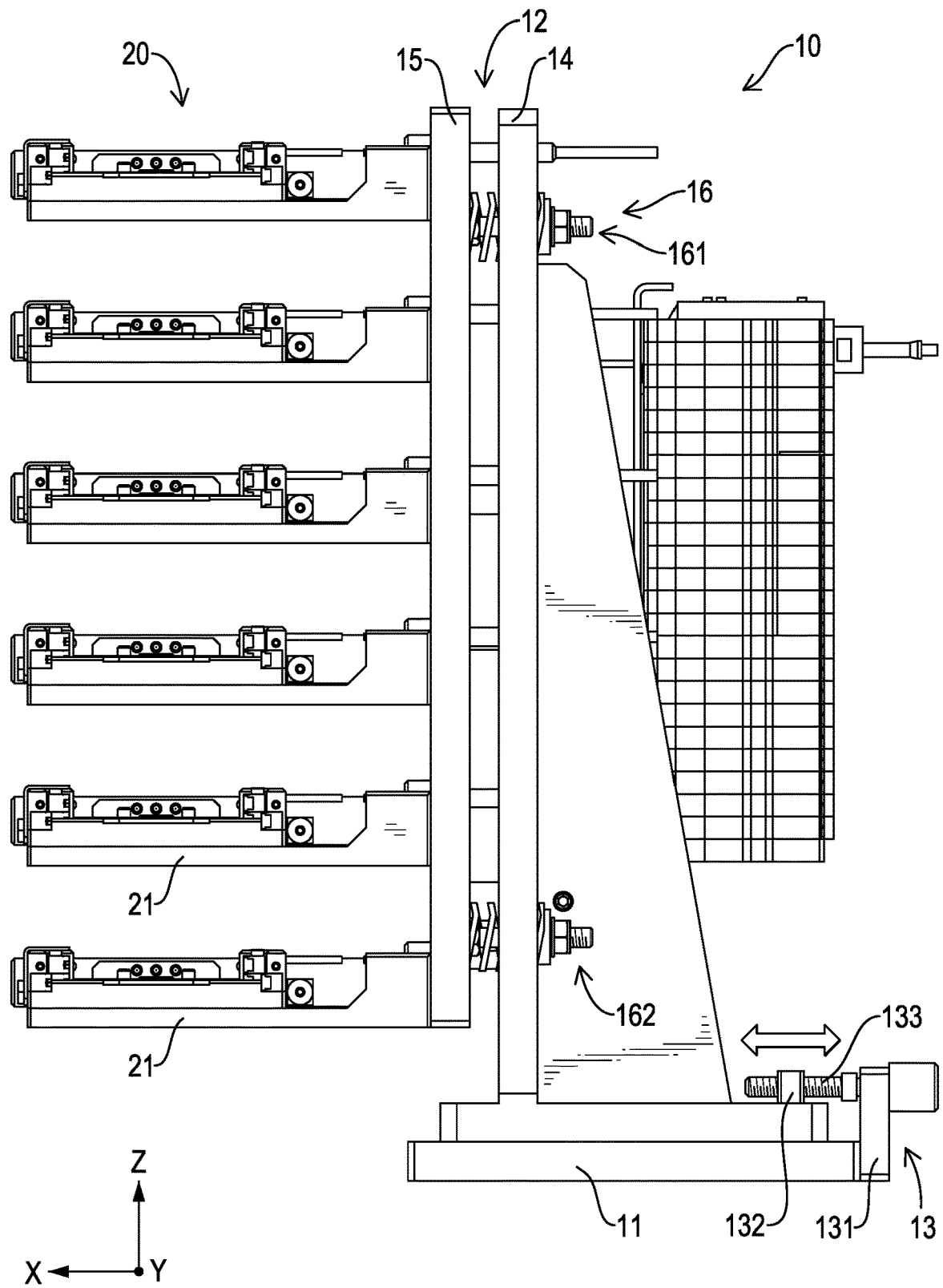
FIG. 15 is a side view of a mounting rack of the transport mechanism for wafers of different sizes and types in FIG. 1.
Figure 16:
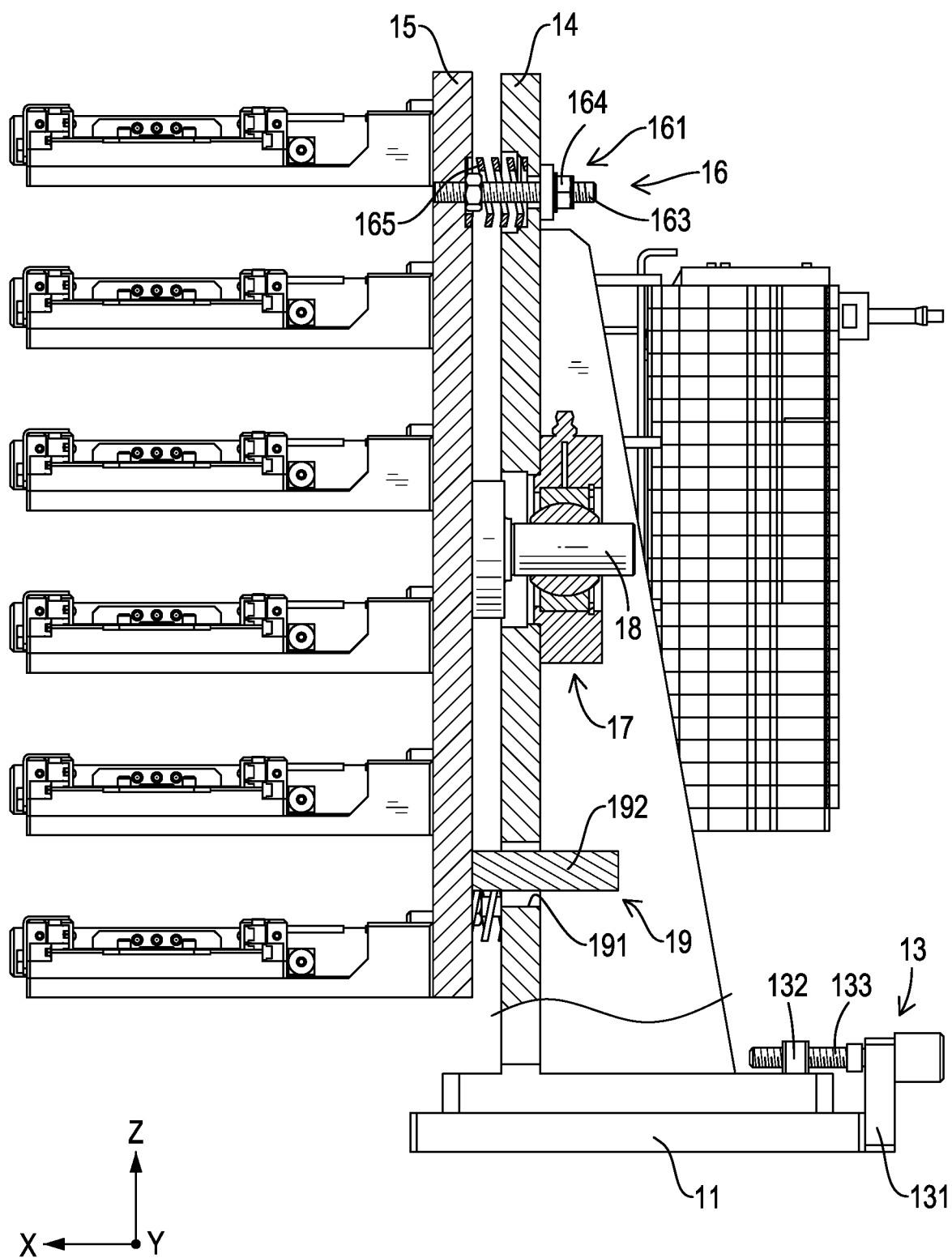
FIG. 16 is a side view in partial section of the mounting rack of the transport mechanism for wafers of different sizes and types in FIG. 1.
Figure 17:
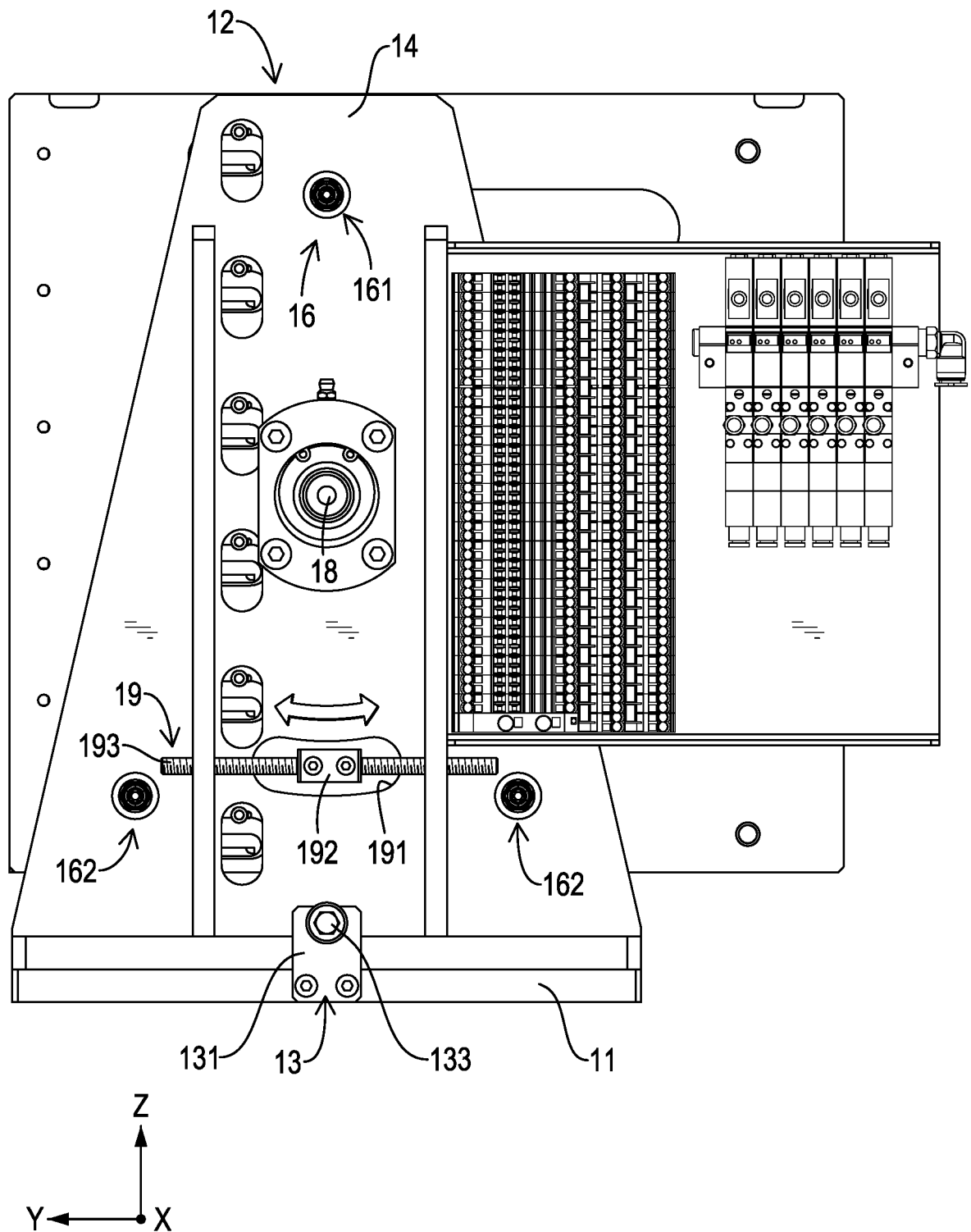
FIG. 17 is a rear side view of the mounting rack of the transport mechanism for wafers of different sizes and types in FIG. 1.

With reference to FIGS. 15 to 17, the mounting rack 10 has a base 11, a movable seat 12, and an X-axis displacement adjusting assembly 13. The movable seat 12 is movably mounted on the base 11. The X-axis displacement adjusting assembly 13 is mounted to the base 11 and is connected to the movable seat 12. The X-axis displacement adjusting assembly 13 makes the movable seat 12 move along the X-axis of the coordinate system, and the X-axis displacement adjusting assembly 13 has a positioning block 131, a linking block 132, and a lead screw 133. The positioning block 131 is mounted to the base 11. The linking block 132 is mounted to the movable seat 12. The lead screw 133 is rotatably mounted to the positioning block 131 and the linking block 132 and has a thread disposed thereon. The positioning block 131 is mounted to the lead screw 133 via the thread. In adjustment, rotate the lead screw 133 to make the linking block 132 move along the X-axis of the coordinate system relative to the lead screw 133. Mounted to the movable seat 12, the linking block 132 makes the movable seat 12 move along the X-axis of the coordinate system relative to the base 11.

With reference to FIGS. 15 to 17, the movable seat 12 has a first base 14, a second base 15, and a Y-axis rotation adjusting assembly 16. The first base 14 is movably mounted on the base 11 and has a universal bearing 17 mounted thereon. The second base 15 is rotatably mounted to the first base 14 and has a rotation shaft 18. The rotation shaft 18 is mounted on a side surface of the second base 15 facing the first base 14, and the rotation shaft 18 is mounted through the universal bearing 17 of the first base 14. The multiple supporting units 20 are mounted on the second base 15 opposite to the rotation shaft 18. The Y-axis rotation adjusting assembly 16 is disposed between the first base 14 and the second base 15, makes the second base 15 rotate about the Y-axis of the coordinate system, and has an upper adjusting set 161 and two lower adjusting sets 162. The upper adjusting set 161 is above the rotation shaft 18. The two lower adjusting sets 162 are below the rotation shaft 18 and are disposed at a spaced interval. The upper adjusting set 161 and the two lower adjusting sets 162 form a triangular zone. Each one of the adjusting sets 161, 162 has a screw 163, a nut 164, and a spring 165. The screw 163 is mounted to the second base 15 and extends out of the first base 14. The nut 164 is adapted in conjunction with an end of the screw 163 extending out of the first base 14 and abuts against the first base 14. The spring 165 is sleeved on the screw 163 and is located between the first base 14 and the second base 15. In adjustment, rotate the screw 163 of the upper adjusting set 161 to make the screw 163 move along the X-axis of the coordinate system. Then the second base 15 rotates about the Y-axis of the coordinate system.

With reference to FIGS. 16 and 17, the movable seat 12 has an X-axis rotation adjusting assembly 19. The X-axis rotation adjusting assembly 19 is disposed between the first base 14 and the second base 15, makes the second base 15 rotate about the X-axis of the coordinate system, and has a sliding groove 191, a protruding block 192, and an adjusting rod 193. The sliding groove 191 is formed through the first base 14. The protruding block 192 is mounted on the side surface of the second base 15 facing the first base 14 and protrudes out of the sliding groove 191. The adjusting rod 193 is mounted through the protruding block 192 and has a thread disposed thereon. The adjusting rod 193 is mounted to the first base 14 via the thread of the adjusting rod 193. In adjustment, rotate the adjusting rod 193 to make the adjusting rod 193 move along the Y-axis of the coordinate system relative to the first base 14. Then the adjusting rod 193 makes the protruding block 192 move within the sliding groove 191. Thus, the second base 15 can rotate about the X-axis of the coordinate system.

The manipulator unit 50 can move along the Y-axis and the Z-axis of the coordinate system, and the manipulator unit 50 can rotate about the Z-axis of the coordinate system. The movable seat 12 can move along the X-axis of the coordinate system via the X-axis displacement adjusting assembly 13. The second base 15 of the movable seat 12 can rotate about the Y-axis of the coordinate system via the Y-axis rotation adjusting assembly 16. The second base 15 of the movable seat 12 can rotate about the X-axis of the coordinate system via the X-axis rotation adjusting assembly 19. Through the displacement and the rotation of the manipulator unit 50, the displacement of the movable seat 12, and the rotation of the second base 15, each one of the two arms 51 is aligned with the corresponding carrier plate 31 and each one of the two arms 51 can be connected to the corresponding carrier plate 31 firmly.

Each one of the multiple carrier units 30 of the carrier device 1 can be of different models. The model of each one of the two carrier plates 31 of the multiple carrier units 30 can be identified by the model identifying set 29 and the identification element 35 disposed thereon. The manipulator unit 50 can be connected to one of the multiple carrier units 30 suitable for carrying a wafer in need of transporting according to the size of the wafer.

With reference to FIGS. 1, 8, 9, and 12, to make the manipulator unit 50 connect with one of the multiple supporting units 20, the driving unit 40 drives the two arms 51 to move toward the two carrier plates 31 of one of the multiple carrier units 30 disposed on the two supporting bases 21 of the corresponding supporting unit 20. Next, the two positioning rods 33 of each one of the two carrier plates 31 extend into the two positioning sockets 55 of the corresponding arm 51. As shown in FIG. 9, when the locking element 56 of each one of the two arms 51 moves to a position above the magnet 22 of a corresponding supporting base 21, the locking element 56 is attracted by the magnet 22 and moves downwardly into the space 23. With reference to FIG. 12, in the meantime, the two protruding portions 57 of the locking element 56 move downwardly to a position below the two beads 54, thereby forming a containing space between the locking element 56 and the two abutted grooves 53 enabling the two beads 54 to move within. At the same time, the first sensor 241 of the sensor set 24 can sense whether the locking element 56 has moved into the space 23 and whether the unlocked state has been formed via the first groove 25 shown in FIG. 8.

Figure 10:
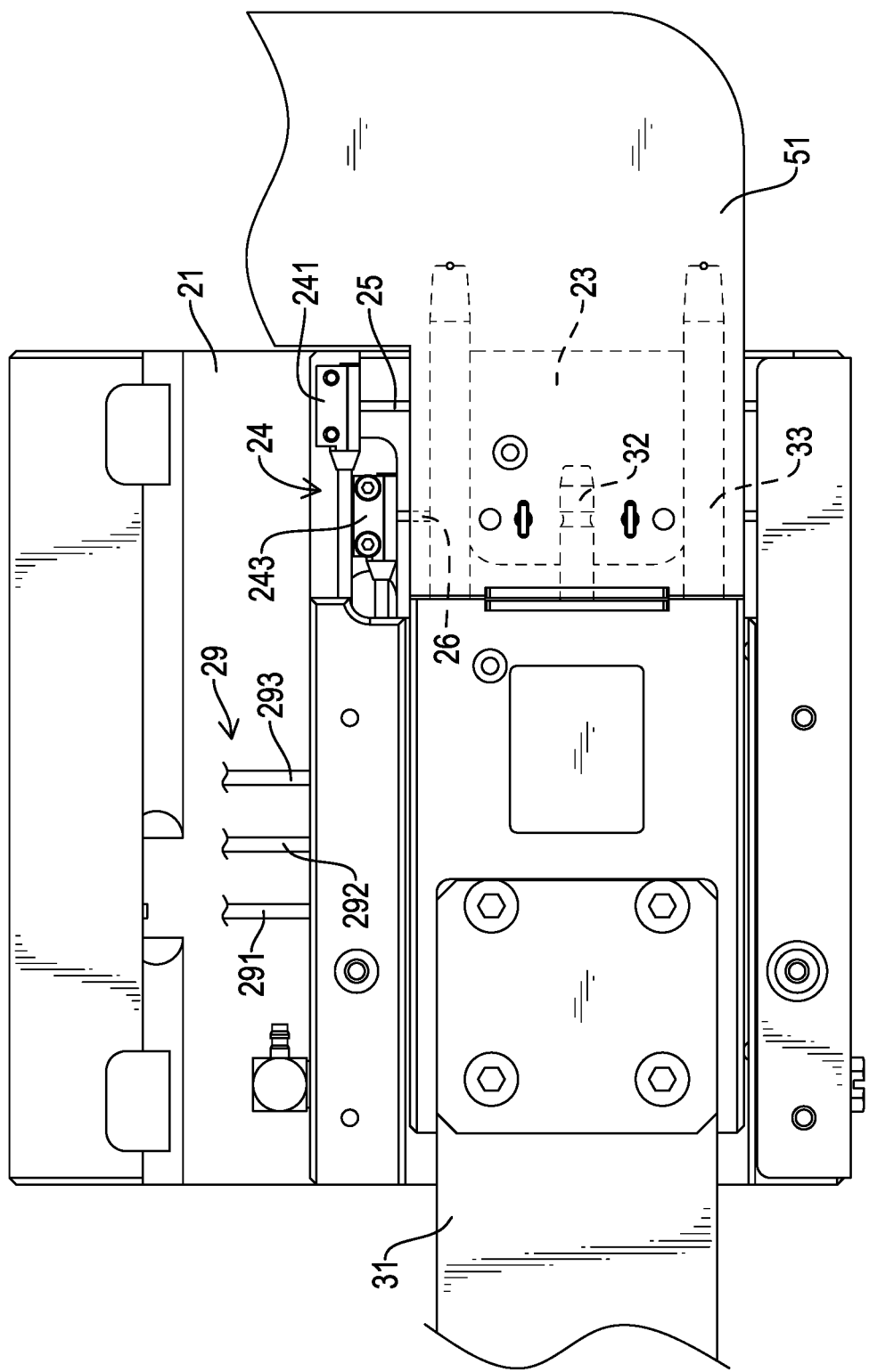
FIG. 10 is another top side view of the transport mechanism for wafers of different sizes and types in FIG. 1, shown with the arm connected to the carrier plate.
Figure 11:
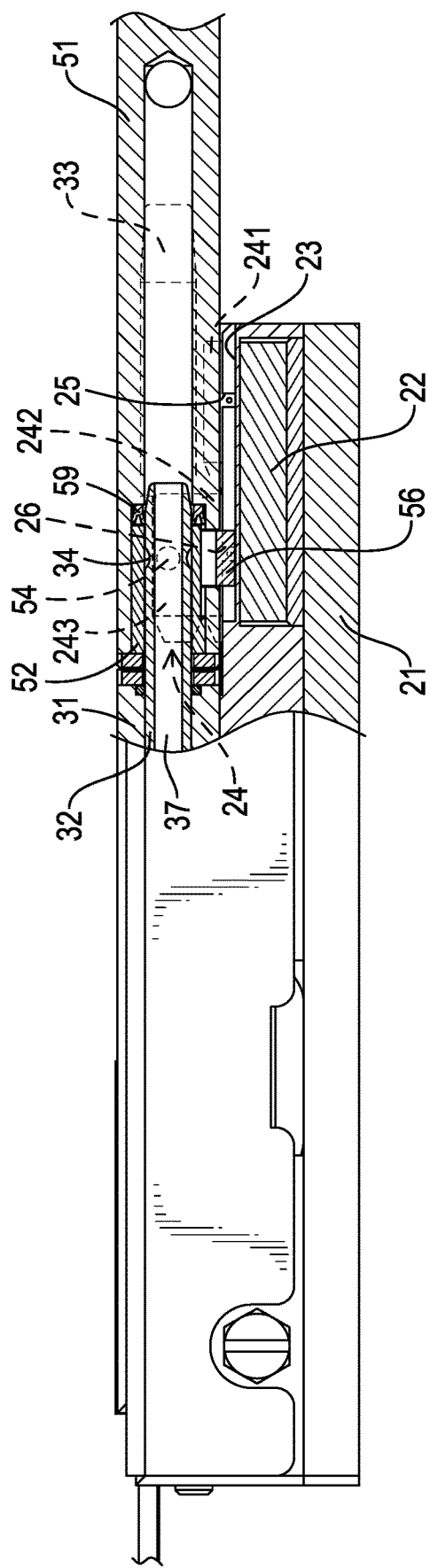
FIG. 11 is another enlarged side view in partial section of the transport mechanism for wafers of different sizes and types in FIG. 10, shown with the arm connected to the carrier plate.

With reference to FIGS. 10 to 12, if the unlocked state has been formed, the two arms 51 move closer to the two carrier plates 31 of one of the multiple carrier units 30. Then the connecting rod 32 of each one of the two carrier plates 31 extends into the connecting socket 52 of the corresponding arm 51. With reference to FIG. 12, the connecting rod 32 moves between the two beads 54 and pushes the two beads 54 into the containing space formed between the locking element 56 and the two abutted grooves 53. Simultaneously, the second sensor 242 of the sensor set 24 senses the locking element 56 via the second groove 26, and whether the connecting rod 32 has extended into the connecting socket 52 of the corresponding arm 51 can be therefore determined.

With reference to FIGS. 13 and 14, after the connecting rod 32 has extended into the connecting socket 52 of the corresponding arm 51, the driving unit 40 drives the said arm 51 to move upwardly. Then the locking element 56 moves out of the space 23, and the attraction of the magnet 22 to the locking element 56 gradually decreases to zero. Pulled by the at least one restoring element 58, the locking element 56 moves back to its original position relative to the said arm 51. The two protruding portions 57 of the locking element 56 respectively push the two beads 54 to move toward each other and to move into the annular groove 34 of the connecting rod 32. After the locking element 56 moves back to its original position, the two protruding portions 57 respectively abut against the two beads 54 and the locked state is formed. Being in the locked state, the connecting rod 32 is positioned in the connecting socket 52. In other words, each one of the two arms 51 is connected to the corresponding carrier plate 31 firmly. The third sensor 243 of the sensor set 24 can sense whether the locking element 56 has actually moved back to its original position.

After each one of the two arms 51 is connected to the corresponding carrier plate 31 automatically, the manipulator device 2 can transport the wafers with the two carrier plates 31 of one of the multiple carrier units 30. The model of the carrier unit 30 connected to the manipulator unit 50 can be substituted according to the size of the wafer in need of transporting.

In the present invention, the driving unit 40 has a vacuum adsorbing device disposed therein. The vacuum adsorbing device communicates with the through hole 37 of the connecting rod 32 of one of the two carrier plates 31 of one of the multiple carrier units 30. The vacuum adsorbing device communicates with the multiple suckers 36 via the through hole 37. In such a configuration, the vacuum adsorbing device can tightly adsorb the wafer placed on the suitable carrier plate 31 via the multiple suckers 36 without dropping and breaking the wafer being transported.

With the aforementioned technical characteristics, the transport mechanism for wafers of different sizes and types of the present invention has the following advantages.

1. The locking element 56 can be automatically locked or unlocked to the carrier plate 31 with the arrangement of the magnet 22 and the space 23 of the supporting base 21. The sensor set 24 can sense whether the locking element 56 is locked or unlocked to the carrier plate 31. Convenience in sensing and assembling are thereby enhanced.

2. The manipulator unit 50 is selectively connected to one of the multiple carrier units 30 of different models. The model of the carrier unit 30 connected to the manipulator unit 50 can be substituted according to the size of the wafer in need of transporting. Hence, the transport mechanism for wafers of different sizes and types in accordance with the present invention can transport wafers of different sizes and types.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A transport mechanism for wafers of different sizes and types comprising:
   a carrier device having
      a mounting rack;
      multiple supporting units mounted on the mounting rack at spaced intervals, and each one of the multiple supporting units having
         two supporting bases, and each one of the two supporting bases having
            a magnet disposed within the supporting base;
            a space formed on a top surface of the supporting base and being above the magnet; and
            a sensor set disposed on the top surface of the supporting base; and
      multiple carrier units respectively mounted to the multiple supporting units, and each one of the multiple carrier units having two carrier plates respectively disposed on the two supporting bases of a corresponding one of the supporting units, and each one of the two carrier plates having
a connecting rod mounted through an end of the carrier plate, being above the space of a corresponding one of the two supporting bases and having
an annular groove formed on an outer surface of the connecting rod; and
two positioning rods mounted through the same end of the carrier plate as the connecting rod, and the two positioning rods being respectively located on two sides of the connecting rod; and
a manipulator device being spaced apart from the carrier device and having
a driving unit; and
a manipulator unit mounted on the driving unit, controlled by the driving unit, selectively connected to one of the multiple carrier units of the carrier device automatically, and having
two arms, and each one of the two arms having
a connecting socket extending into an end of the arm and having
two abutted grooves respectively formed on two sides of the connecting socket;
two beads disposed in the two abutted grooves of the connecting socket respectively;
two positioning sockets extending into the same end of the arm as the connecting socket and being respectively located beside the connecting socket;
a locking element movably mounted to the arm, abutting against the two beads, and having
two protruding portions respectively formed on two inner side surfaces of the locking element; and
at least one restoring element connected to the arm and the locking element; wherein
when each one of the two arms of the manipulator unit is driven by the driving unit and moves to the carrier device, each one of the two arms is then connected to a respective one of the two carrier plates of one of the multiple carrier units;
the sensor set senses the connection between each one of the two arms and the corresponding carrier plate;
the two positioning rods of each one of the two carrier plates extend into the two positioning sockets of the corresponding arm, and the connecting rod of each one of the two carrier plates extends into the connecting socket of the corresponding arm;
the locking element of each one of the two arms is attracted by the magnet and moves downwardly into the space of the corresponding supporting base to form an unlocked state;
when each one of the two arms is driven by the driving unit and moves upwardly, the attraction of the magnet to the locking element gradually decreases to zero and the locking element gradually moves back to its original position relative to the arm; and
the two protruding portions of the manipulator unit respectively push the two beads to move toward each other and the two beads move into the annular groove of the connecting rod to position the connecting rod to form a locked state.

2. The transport mechanism as claimed in claim 1, wherein
each one of the two supporting bases of the supporting unit has
a first groove formed on the supporting base and communicating with the space of the supporting base; and
a second groove formed on the supporting base and communicating with the space of the supporting base; and
the sensor set has
a first sensor disposed on the supporting base and facing the first groove;
a second sensor disposed on the supporting base and facing the second groove; and
a third sensor disposed on the second sensor.

3. The transport mechanism as claimed in claim 1, wherein
each one of the two supporting bases of the supporting unit has
an adsorption positioning element adsorbing the corresponding carrier plate disposed thereon; and
a carrier plate detector detecting whether the corresponding carrier plate is disposed on the supporting base.

4. The transport mechanism as claimed in claim 2, wherein
each one of the two supporting bases of the supporting unit has
an adsorption positioning element adsorbing the corresponding carrier plate disposed thereon; and
a carrier plate detector detecting whether the corresponding carrier plate is disposed on the supporting base.

5. The transport mechanism as claimed in claim 1, wherein each one of the two supporting bases of the supporting unit has a model identifying set disposed thereon, and the model identifying set has a first identifying element, a second identifying element, and a third identifying element disposed at spaced intervals and disposed on the supporting base.

6. The transport mechanism as claimed in claim 2, wherein each one of the two supporting bases of the supporting unit has a model identifying set disposed thereon, and the model identifying set has a first identifying element, a second identifying element, and a third identifying element disposed at spaced intervals and disposed on the supporting base.

7. The transport mechanism as claimed in claim 1, wherein each one of the two carrier plates of the carrier unit has an identification element disposed thereon.

8. The transport mechanism as claimed in claim 2, wherein each one of the two carrier plates of the carrier unit has an identification element disposed thereon.

9. The transport mechanism as claimed in claim 5, wherein each one of the two carrier plates of the carrier unit has an identification element disposed thereon.

10. The transport mechanism as claimed in claim 6, wherein each one of the two carrier plates of the carrier unit has an identification element disposed thereon.

11. The transport mechanism as claimed in claim 1, wherein
a coordinate system including an X-axis, a Y-axis, and a Z-axis being perpendicular to one another is defined in the transport mechanism; and
the mounting rack has
a base;
a movable seat movably mounted on the base; and an X-axis displacement adjusting assembly mounted to the base, connected to the movable seat, and making the movable seat move along the X-axis of the coordinate system.

12. The transport mechanism as claimed in claim 2, wherein
a coordinate system including an X-axis, a Y-axis, and a Z-axis being perpendicular to one another is defined in the transport mechanism; and
the mounting rack has
a base;
a movable seat movably mounted on the base; and
an X-axis displacement adjusting assembly mounted to the base, connected to the movable seat, and making the movable seat move along the X-axis of the coordinate system.

13. The transport mechanism as claimed in claim 11, wherein
the X-axis displacement adjusting assembly has
a positioning block mounted to the base;
a linking block mounted to the movable seat; and
a lead screw rotatably mounted to the positioning block and the linking block and having
a thread disposed thereon, and the positioning block mounted to the lead screw via the thread of the lead screw.

14. The transport mechanism as claimed in claim 12, wherein
the X-axis displacement adjusting assembly has
a positioning block mounted to the base;
a linking block mounted to the movable seat; and
a lead screw rotatably mounted to the positioning block and the linking block and having
a thread disposed thereon, and the positioning block mounted to the lead screw via the thread of the lead screw.

15. The transport mechanism as claimed in claim 11, wherein the movable seat has
a first base movably mounted on the base;
a second base rotatably mounted to the first base, and the multiple supporting units mounted on the second base; and
a Y-axis rotation adjusting assembly disposed between the first base and the second base and making the second base rotate about the Y-axis of the coordinate system.

16. The transport mechanism as claimed in claim 12, wherein the movable seat has
a first base movably mounted on the base;
a second base rotatably mounted to the first base, and the multiple supporting units mounted on the second base; and
a Y-axis rotation adjusting assembly disposed between the first base and the second base and making the second base rotate about the Y-axis of the coordinate system.

17. The transport mechanism as claimed in claim 15, wherein the Y-axis rotation adjusting assembly has
an upper adjusting set having
a screw mounted to the second base and extending out of the first base;
a nut adapted in conjunction with the screw and abutting against the first base; and
a spring sleeved on the screw and located between the first base and the second base; and
two lower adjusting sets disposed below the upper adjusting set, and each one of the two lower adjusting sets having
a screw mounted to the second base and extending out of the first base;
a nut adapted in conjunction with the screw and abutting against the first base; and
a spring sleeved on the screw and located between the first base and the second base.

18. The transport mechanism as claimed in claim 15, wherein the movable seat has an X-axis rotation adjusting assembly disposed between the first base and the second base and making the second base rotate about the X-axis of the coordinate system.

19. The transport mechanism as claimed in claim 18, wherein the X-axis rotation adjusting assembly has
a sliding groove formed through the first base;
a protruding block mounted on the second base and protruding out of the sliding groove; and
an adjusting rod mounted through the protruding block, having a thread disposed thereon, and mounted to the first base via the thread of the adjusting rod.

* * * * *